US007538320B2

(12) United States Patent
Sperline

(10) Patent No.: US 7,538,320 B2
(45) Date of Patent: May 26, 2009

(54) ION DETECTION DEVICE AND METHOD WITH COMPRESSING ION-BEAM SHUTTER

(75) Inventor: Roger P. Sperline, Tucson, AZ (US)

(73) Assignee: The Arizona Board of Regents on behalf of The University of Arizona, Tucson, AZ (US)

( * ) Notice: Subject to any disclaimer, the term of this patent is extended or adjusted under 35 U.S.C. 154(b) by 147 days.

(21) Appl. No.: 11/769,513

(22) Filed: Jun. 27, 2007

(65) Prior Publication Data

US 2008/0179515 A1 Jul. 31, 2008

Related U.S. Application Data

(60) Provisional application No. 60/816,821, filed on Jun. 27, 2006.

(51) Int. Cl.
*H01J 37/244* (2006.01)
*B01D 59/44* (2006.01)

(52) U.S. Cl. .................. 250/286; 250/290; 250/396 R; 250/397

(58) Field of Classification Search ................. 250/286, 250/290, 396 R, 397
See application file for complete search history.

(56) References Cited

U.S. PATENT DOCUMENTS 5,200,614 A 4/1993 Jenkins
6,040,573 A 3/2000 Sporleder et al.
6,683,301 B2 * 1/2004 Whitehouse et al. ........ 250/288
6,791,078 B2 9/2004 Giles et al.
6,872,941 B1 * 3/2005 Whitehouse et al. ........ 250/288
6,906,319 B2 6/2005 Hoyes
6,992,283 B2 1/2006 Bateman et al.
7,151,255 B2 12/2006 Weiss et al.

* cited by examiner

*Primary Examiner*—Nikita Wells
(74) *Attorney, Agent, or Firm*—Oblon, Spivak, McClelland, Maier & Neustadt, P.C.

(57) ABSTRACT

An ion detection device, method and computer readable medium storing instructions for applying voltages to shutter elements of the detection device to compress ions in a volume defined by the shutter elements and to output the compressed ions to a collector. The ion detection device has a chamber having an inlet and receives ions through the inlet, a shutter provided in the chamber opposite the inlet and configured to allow or prevent the ions to pass the shutter, the shutter having first and second shutter elements, a collector provided in the chamber opposite the shutter and configured to collect ions passed through the shutter, and a processing unit electrically connected to the first and second shutter elements. The processing unit applies, during a first predetermined time interval, a first voltage to the first shutter element and a second voltage to the second shutter element, the second voltage being lower than the first voltage such that ions from the inlet enter a volume defined by the first and second shutter elements, and during a second predetermined time interval, a third voltage to the first shutter element, higher than the first voltage, and a fourth voltage to the second shutter element, the third voltage being higher than the fourth voltage such that ions that entered the volume are compressed as the ions exit the volume and new ions coming from the inlet are prevented from entering the volume. The processing unit is electrically connected to the collector and configured to detect the compressed ions based at least on a current received from the collector and produced by the ions collected by the collector.

41 Claims, 10 Drawing Sheets

ION DETECTION DEVICE AND METHOD WITH COMPRESSING ION-BEAM SHUTTER

CROSS REFERENCE TO RELATED APPLICATIONS

The present application claims priority from provisional application Ser. No. 60/816,821, filed on Jun. 27, 2006. The entire content of this provisional application is incorporated herein by reference.

STATEMENT REGARDING FEDERALLY SPONSORED RESEARCH OR DEVELOPMENT

This invention was made with government support under grant no. DE-AC04-94AL85000 awarded by Department of Energy. The government has certain rights in the invention.

BACKGROUND OF THE INVENTION

1. Field of the Invention

The present invention is related in general to the field of detecting materials and specifically to an ion detection device with a shutter that provides an improved resolution for detecting traces of materials.

2. Discussion of the Background

The rapid identification of explosives, explosive residues, chemical agents, airborne toxins, and other volatile organic compounds has undergone a revolution in recent years by the progress made in the field of ion mobility instruments. Despite the transformation that has occurred in ion mobility spectrometry, the full potential of the technique has not yet been realized, particularly in miniaturized, portable spectrometers. This is partially due to the low numbers of ions generated in the small ionizers employed in miniaturized ion mobility spectrometers. As will be appreciated by one of ordinary skill in the art, existing devices are limited in detecting traces of materials by the low number of ions generated by the materials in a ionization chamber because the existing devices require a certain number of ions (above a threshold) to be present in order to detect the materials to which the ions belong.

FIG. 1 shows a typical ion mobility spectrometer (IMS) that includes an ionization reaction chamber 10 in which a gas 7 enters and is ionized, an ion drift chamber 15 coupled in series with the reaction chamber 10 through an ion/molecule injection shutter 12, and a collector plate 16 disposed inside the drift chamber 15, opposite the injection shutter 12. In operation, a carrier gas transports gases or vapor from a material to be analyzed into the reaction chamber 10, where it is ionized by an ionization source (not shown). Most of the resulting ions are from the carrier gas molecules ("reactant ions"), and multiple collisions occur between ionized species and the analyte molecules. These collisions transfer ion charges to the analyte molecules. All ions move, predominantly, by "electrophoresis" in the electric field inside the spectrometer. The electric field is formed by conventional techniques in the reaction chamber 10 and the drift chamber 15 to lead the ions from the reaction chamber to the drift chamber and to reach the collector plate. This process is called "flow". The combined portions of the apparatus, outside the ionizer, where ions move by electrophoresis are called, generically, the "tube."

For improved resolution, an aperture grid 17 serves as a guard for the collector plate 16 to prevent precharging of the collector due to charging by the approaching "ion packet." This grid also helps maintain the uniformity of the electric field responsible for the motion of the ions.

Periodically, the ion shutter 12 (a charged grid or grids) is opened to allow a pulse of ions into the drift chamber 15. The time of arrival of each ion species at the collector plate 16 is determined by the ion mobility in a non-ionizing gas filling the drift chamber 15. The quantity of ions collected as a function of drift time is recorded by a microprocessor (not shown).

Two general types of ion-beam shutter (IBS) have been employed in the past. One is conventionally preferred "Bradbury-Nielsen" ("B-N") design which consists of a planar array of parallel thin wires. Alternate wires are connected electrically and an electrical potential is applied or removed to block or allow the passage of ions across the plane. This design gives the most precise start times for the drifting ions. Another design is "Tyndall-Powell" ("T-P") design which uses two closely spaced planes of electrodes, each plane consisting of either parallel wires or screens. This design is easier to construct than the B-N IBS, but requires a higher voltage difference to block the ion-beam and the ion packet is less precisely defined in both time and space.

Both the B-N and T-P IBSs are "opened" for a time range between 100 and 500 μs to allow passage of an ion packet. The direct current measuring devices used in modern day IMSs are only able to measure currents in the picoamp range, or approximately 6 million ions per second. Multiplication by the width (typically 1000 μs of an ion packet arriving at the detector and using the approximation of the peak shape as a triangle reveals that each detectable packet contains approx 3000 ions. This would be the nominal detection limit for an IMS containing a Ni-63 radioactive ionization source of approximately 10 mCuries radioactivity. Such small ion packet sizes can lead to poor linear dynamic range, false positive responses, and numerous other problems.

The response of the IMS device is proportional to both ionizer activity and sample size over large ranges. Miniature IMS devices might only contain 10 μCuries of radioactive material. As a result, a sample nominally 1000 times larger must be introduced to a miniature IMS device to produce an ion packet of 3000 ions, when compared with a stationary IMS device containing 10 mCuries of radioactive material. To reduce the sample size and thus the detection limit, it is desirable either to a) increase the sensitivity of the detector to available ions, b) increase the number of ions in a packet, or c) cause the number of ions to arrive within a shorter time thus increasing the momentary ion current. All three circumstances increase the signal-to-noise ratio of a sample measurement.

Both the B-N and T-P IBSs are operated with the minimum voltage difference necessary to block the ion-beam. Due to the delay between operation of the shutter and arrival of ions of interest at the detector, electrical disturbances caused by shutter operation die out before measurements are made, so larger voltages could be used.

The operation of an IMS and any IBS can be understood through a potential (V, Volts) vs. distance (Z, cm) graph for the tube. FIG. 2A shows such a graph for a schematic IMS device. The slope of the potential vs. distance is the electrical field intensity, and determines the direction and velocity of flow of a given species of ion. Ions only move "electrically downhill", i.e., negative ions (anions) only move toward regions of more positive voltages and positive ions (cations) only move toward regions of more negative voltages. FIG. 2A could be used for either cations or anions.

It is not necessary that the electrophoresis tube be round or any particular shape, but the parameters of the electrode array must allow a packet of ions released by the shutter to arrive at the collector plate electrode 16 with the minimum distortion in time, i.e., ideally, ions on the frontal boundary of a packet should arrive at 16 simultaneously.

A "reaction region" at higher absolute potential in FIG. 2A lies to the left end of the graph and consists of electrodes, open along the central axis of the tube, called "guard rings." In FIG. 2A there are arbitrarily two such, labeled G1 and G2, at steadily decreasing absolute potential from left to right. An ionizer (10 in FIG. 1) produces "reactant ions" which begin to transfer charge with analyte molecules in the ionizer and continue to do so as the reactant ions flow by electrophoresis through the reaction region. A "drift region" at progressively lower absolute potentials in FIG. 2A lies to the right end of the graph and consists of open guard rings. In FIG. 2A there are, arbitrarily, n such, labeled G2, G4, . . . , Gn. At the end of the drift region is the collector plate 16, conventionally, but not necessarily, held at electrical ground potential.

With the shutter in the open position, to allow ion flow, the electrodes form an array of monotonically decreasing absolute voltages. A linearly decreasing array of voltages is conventionally configured with electrical resistors, but the linearity is not necessary—different regions can have larger or smaller slopes. It is convenient for this discussion to place all the voltages on a single line with the slope given by E=dV/dZ and called the "mean slope line." The electrical field E between any two guard ring electrodes is influenced by other electrodes, and is not simple to calculate exactly, but between two planar electrodes consisting of either a plane of closely spaced fine wires or a plane of fine metal screen, completely spanning the lumen of the tube, E=V2-V1/(Z2-Z1). Ion electrophoresis speed is proportional to E. The wire grids and screens are called generically "screens".

Computer modeling, with the program Simion 7.0, of drift tubes with planar end electrodes (equivalent to a shutter screen and a collector plate) shows that the potential at any point near the central axis of particular guard ring has an average value dependent on all the other electrodes which are electrically "visible" to ions at the point of interest. Well-constructed screens, grids, solid conductor electrodes, and thick insulators are electrically "opaque" and electrodes lying on opposite sides of one of these are not "visible" to one-another.

To operate the shutter, the voltage Vs of screen S1 is controlled. The shutter is "closed" to ions when Vs1 is closer to zero than is Vs2 (FIG. 2B). To reach 16 and be detected, ions would have to flow "uphill" against the potential gradient between S1 and S2. In an atmospheric pressure electrophoresis system such as IMS, ions have essentially no momentum and cannot "coast" over any such voltage barriers. The shutter is "open" to ions when Vs1>Vs2 and, approximately, Vs1<Vg2 (FIG. 2A). In this situation, ions flow "downhill" both from G2 to S1 and from S1 to S2.

The result of the automatic averaging of voltages occurring in the centers of the guard rings is that when Vs1<Vg2<Vg1, and Vs1 falls below the mean slope, (previously described, see FIG. 2A), the potential in the center of the lumen of G2 is lower than it is nearer the annulus of G2. This condition results in a focusing of ions toward the center of the guard ring. Ions are preserved because they cannot reach the annulus of G2 and be neutralized.

On the other hand, when Vs1 is above the mean slope, the voltage at the center of G2 is higher than at the periphery; ions move toward the annulus and begin to be neutralized on the electrode. This process results in a loss of possible sensitivity until Vs1 is held at or below the mean slope voltage for sufficient time for a fresh volume of ions to be carried into this portion of the reaction region. In addition, the acceleration of the ion beam due to the increased gradient between G2 and S1 causes the concentration of ions to be lower in the region of space from which ions will be drawn to fill the space between S1 and S2, when the shutter is opened.

In some conventional instruments, Vs1 and Vs2 are changed simultaneously and in opposite directions, to maintain an average voltage in the vicinity of the screens. This mode of operation avoids depletion of the ions in the vicinity of G2. Another means to avoid depletion of ions in the region of G2 would be to change only Vs2, while keeping Vs1 on the mean slope line. A possible disadvantage to this mode of operation would be that the voltage gradient in the drift region, and hence the ion drift times, would depend on the maximum value of Vs2 and a more complicated electrical circuit might be necessary to control it. Without proper control of Vs2, drift times would be unreliable.

In the closed state, a TP-IBS forces ions to flow toward S1 and be neutralized. Within a very short time there are no ions between S1 and S2. As a result, the open time of the shutter must be long enough to allow ions to move completely across the S1-S2 space (time depends on both mobility and E in the space) before any ions can proceed to the detector. If it takes 250 μs for a more mobile ion of interest to pass from S1 to S2, the shutter must be open for 750 μs, to obtain a 500 μs pulse of ions entering the drift region. The less mobile ions of interest require more time to pass from S1 to S2 and fewer of those slower ions will pass S2 before the shutter is closed. When the shutter is closed, the flow of ions is reversed between S1 and S2, and the remaining, slower ions are neutralized back at S1.

The overall result is a lowered sensitivity to the less mobile ions. This sensitivity can be regained by lengthening the shutter pulse width, but this broadens the detected peaks due to the faster ions. In normal construction, the distance between S1 and S2 is kept to a minimum to reduce the bias against less mobile ions and to reduce the voltage difference required to close the shutter.

SUMMARY OF THE INVENTION

According to one aspect of the present invention, there is provided an ion detection device having a chamber having an inlet and configured to receive ions through the inlet, a shutter provided in the chamber opposite the inlet and configured to allow or prevent the ions to pass the shutter, the shutter having first and second shutter elements, a collector provided in the chamber opposite the shutter and configured to collect ions passed through the shutter, and a processing unit electrically connected to the first and second shutter elements. The processing unit is configured to apply, during a first predetermined time interval, a first voltage to the first shutter element and a second voltage to the second shutter element, the second voltage being lower than the first voltage such that ions from the inlet enter a volume defined by the first and second shutter elements, and during a second predetermined time interval, a third voltage to the first shutter element, higher than the first voltage, and a fourth voltage to the second shutter element, the third voltage being higher than the fourth voltage such that ions that entered the volume are compressed as the ions exit the volume and new ions coming from the inlet are prevented from entering the volume. The processing unit is electrically coupled to the collector and configured to detect the compressed ions based at least on a current received from the collector and produced by the ions collected by the collector.

According to another aspect of the present invention, there is provided a method for detecting ions in an ion detection device having first and second shutter elements provided in a chamber, the first shutter element facing an inlet and the shutter facing a collector that collects ions passing through the shutter, the ion detection device having a processing unit electrically coupled to the collector and to the first and second shutter elements, the method including applying, during a first predetermined time interval, a first voltage to the first shutter element and a second voltage to the second shutter element, the second voltage being less than the first voltage such that ions that enter the chamber of the ion detection device passes through the first shutter element and accumulate in a volume defined by the first and second shutter elements, applying, during a second predetermined time interval, a third voltage to the first shutter element, higher than the first voltage, and a fourth voltage to the second shutter element, such that ions that entered the volume are compressed as the ions exit the volume and new ions that enter the chamber are prevented from entering the volume, and detecting the compressed ions based at least on a current received from the collector and produced by ions arriving at the collector after the third and fourth voltages have been applied.

Still according to another aspect of the present invention, there is provided a computer-readable storage medium encoded with computer instructions for operating an ion detection device including a chamber having an inlet and configured to receive ions through the inlet, a shutter provided in the chamber opposite the inlet and configured to allow or prevent the ions to pass the shutter, the shutter having first and second shutter elements, a collector provided in the chamber opposite the shutter and configured to collect ions passed through the shutter, and a processing unit electrically coupled to the first and second shutter elements and to the collector, the instructions when executed by the processing unit resulting in performance of steps including applying, during a first predetermined time interval, a first voltage to the first shutter element and a second voltage to the second shutter element, the second voltage being less than the first voltage such that ions that enter the chamber of the ion detection device passes through the first shutter element and accumulate in a volume defined by the first and second shutter elements, applying, during a second predetermined time interval, a third voltage to the first shutter element, higher than the first voltage, and a fourth voltage to the second shutter element, such that ions that entered the volume are compressed as the ions exit the volume and new ions that enter the chamber are prevented from entering the volume, and detecting the compressed ions based at least on a current received from the collector and produced by ions arriving at the collector after the third and fourth voltages have been applied.

BRIEF DESCRIPTION OF THE DRAWINGS

The accompanying drawings, which are incorporated in and form part of the specification, illustrate an embodiment of the present invention and, together with the description, serve to explain the principles of the invention.

DETAILED DESCRIPTION OF THE INVENTION

Figure 1:
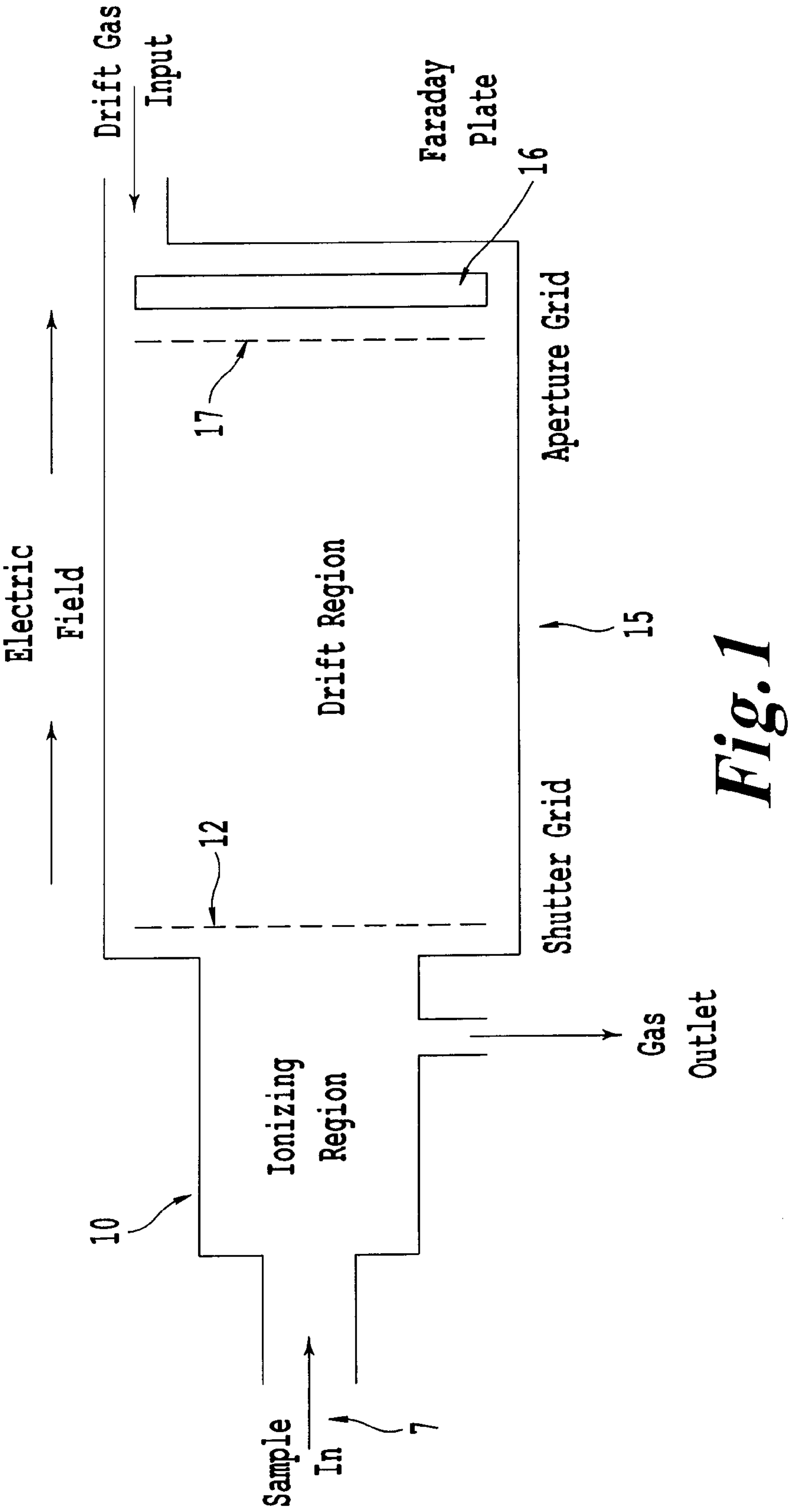
Fig. 1 PRIOR ART
FIG. 1 is a schematic diagram of a prior art ion mobility spectrometer.
Figure 2A:
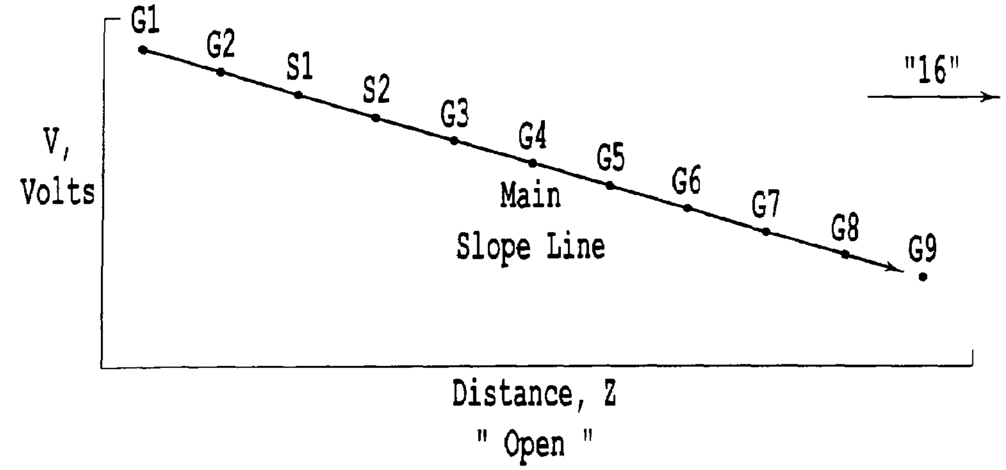
FIGS. 2A and 2B are graphs of potential (V, Volts) vs. distance (Z, cm) for a schematic IMS device containing a conventional Tyndall-Powell type IBS in the open and closed phases of operation.
Figure 2B:
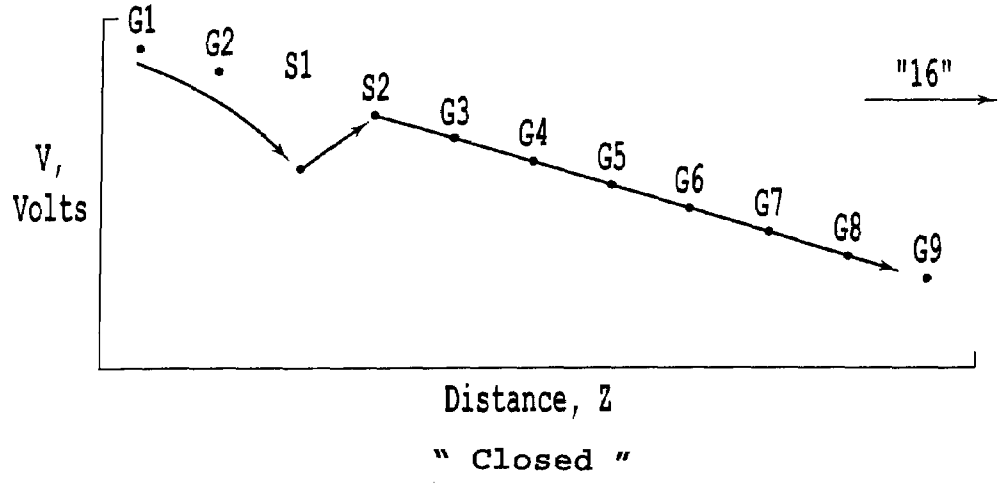
Figure 3:
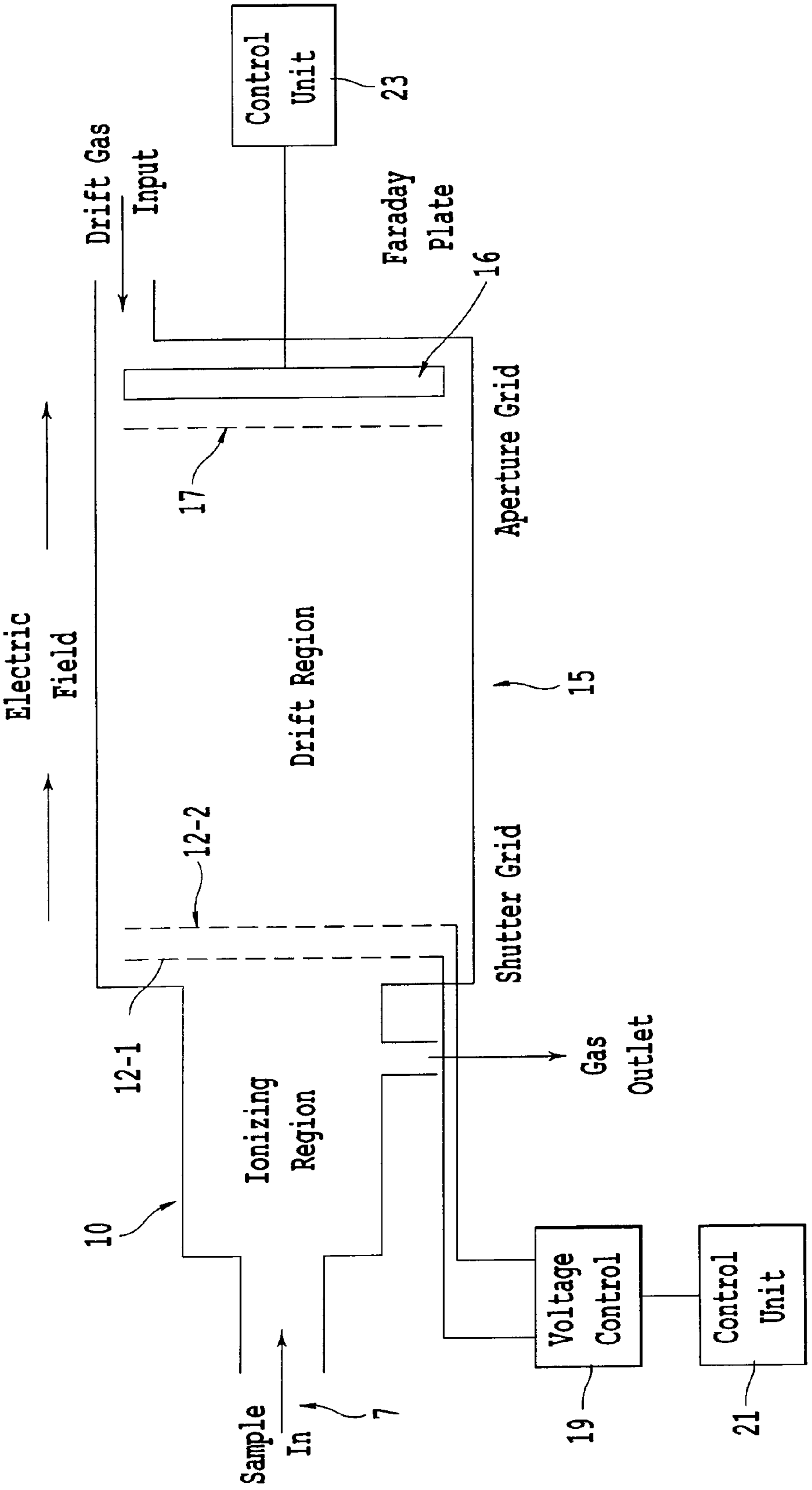
FIG. 3 is a schematic diagram of an ion detection device according to an embodiment of the present invention.

Referring now to the drawings, wherein like reference numerals designate identical or corresponding parts throughout the several view, and more particularly to FIG. 3 thereof, FIG. 3 shows an ion detection device according to one embodiment of the present invention. In FIG. 3, the ion detection device has the shutter 12 including two shutter elements 12-1 and 12-2 that can be electrically controlled independently one from the other. The shutter elements 12-1 and 12-2 can include screens or grids. Each of the shutter elements 12-1 and 12-2 is connected to a voltage source 19 that provides an appropriate voltage to the shutter 12. The voltage source may be based on a battery in one embodiment. The voltage source 19 is connected to a control unit 21 that provides a timing for applying a corresponding voltage to each of the shutter elements 12-1 and 12-2 and also a value of the applied voltage. The control unit 21 may be a dedicated circuit or a processing unit that includes a programmable microprocessor. The control unit 21 may also be implemented in software performed by a computer microprocessor.

In another embodiment, another control unit 23 is provided to collect and estimate a current determined by the plate electrode 16 when the ions generated in the ionizing region reach the plate electrode 16. The control unit 23 may by identical to the control unit 21 or the control unit 23 may be the control unit 21. The control unit 21 determines the ions entering the ion detection device based on the time of flight of the ions between the shutter elements 12-1 and 12-2 and also based on a current received from the electrode plate 16 (collector). The current from the electrode plate 16 is determined by the number of ions that reach the electrode plate 16 after passing the shutter 12.

The shutter elements 12-1 and 12-2 are shown in following figures as a pair of elements S1 and S2 and these elements can act as an open/closed gate for ions. The space between S1 and S2 and the voltage differences between them are newly configured, to provide not only shutter action but also to provide sensitivity and resolution benefits in the ion detection device as discussed hereinafter. As discussed above, one of ordinary skill in the art would know that the following embodiments are equally applicable to positive and negative ions and for the negative ions one would have to change the polarity of the voltages shown in the following figures in order to obtain the same effect as for the positive ions discussed next.

Figure 4A:
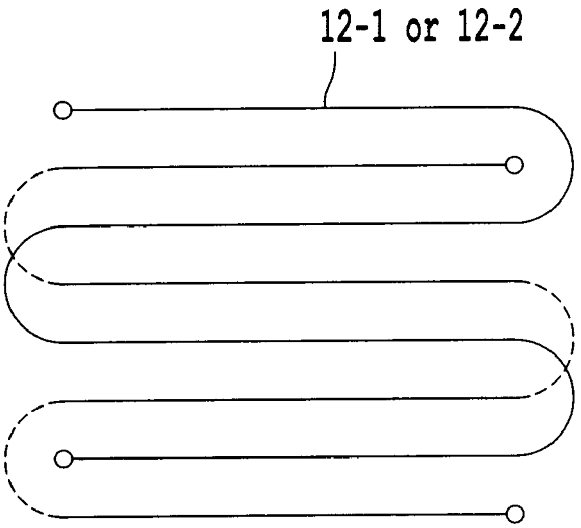
FIGS. 4A and 4B are schematic diagrams of shutter elements of the ion detection device.
Figure 4B:
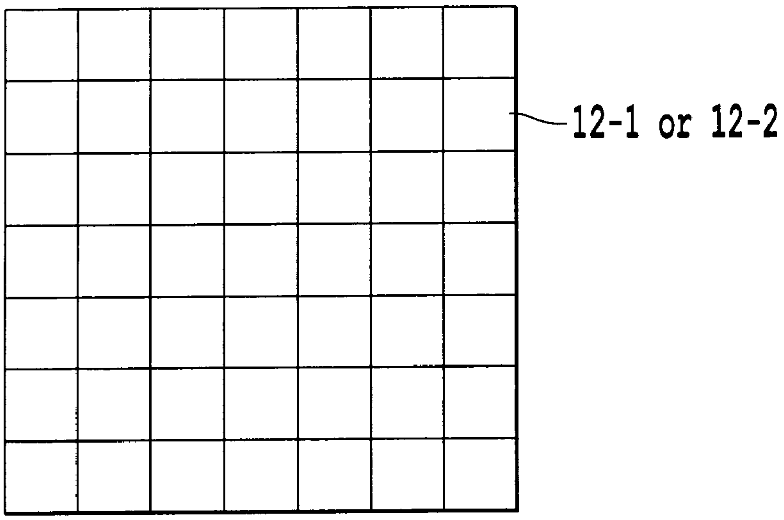
Figure 5A:
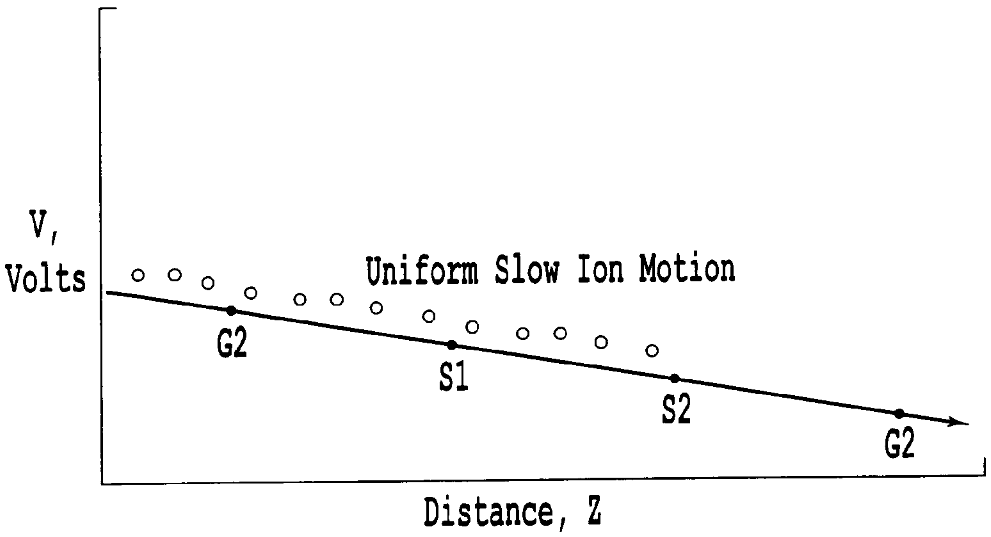
FIGS. 5A and 5B are graphs of potential (V, Volts) vs. distance (Z, cm) for a schematic IMS device containing a three screen IBS of the type described in one embodiment of this invention, illustrating the Accumulation and Compression phases of operation.
Figure 5B:
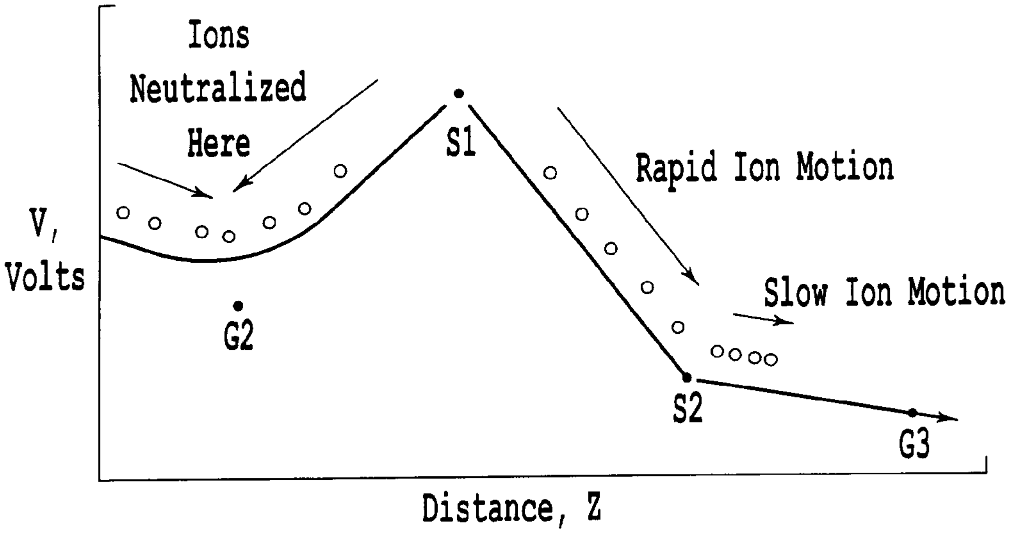

The volume between S1 and S2 is considered when Vs1 is not merely changed to values at or below the mean slope, but is purposely raised above mean slope. An increase in Vs1 to a point substantially higher than the mean slope causes ions between G2 and S1 to flow to the left, effectively closing the shutter in a new fashion. When Vs1 is raised, any ions lying between S1 and S2 move toward the right at speeds greater than ions of the same species lying in regions having the mean slope field. When these ions reach S2, they penetrate the S2 element and continue to the right at speeds dictated by the field in the drift region (i.e., at the mean slope field in this example). FIGS. 5A and 5B show the electric fields for this embodiment. S1 and S2 elements correspond to the shutter elements 12-1 and 12-2 and in one embodiment are arrays of wires or screens as shown for example in FIGS. 4A and 4B. Other configurations are possible as long as the ions are allowed to pass through the S1 and S2 elements and various combinations of the screens and grids for the S1 and S2 elements are also possible.

The result of these speed changes is to compress the packet of ions originally distributed between S1 and S2 into a concentrated, shorter packet. This packet then proceeds to be separated and detected by the electrode plate 16 and the control unit 23. By compressing the ions in the volume S1 to S2, a low density of available ions is elevated to a large density of ions. The increased density of ions combined with the increased distance between S1 and S2, compared with conventional devices, result in a packet containing a number of ions which is above a minimum threshold required by the ion detection device to detect ions of a material.

The ion detecting device of this embodiment thus solves the problems of the background art device without introducing substantial sources of noise by providing the available ions in the ionizing region in a compressed form to the electrode plate 16. The compressed ion packets, a function of the applied voltage at the shutter elements, as will be discussed next, increases the number of ions in a given volume and a given amount of time allowing the ion detecting device according to the invention to detect traces of ions that conventional devices are not capable of determining.

As the distance between S1 and S2 is increased, following the mean slope, more ions are accumulated between S1 and S2 and are compressed when Vs1 is raised. To achieve the same packet length as in the case where the distance between S1 and S2 is smaller, a larger voltage is required to increase the slope and compress the ion packet.

NUMERICAL EXAMPLES

In a conventional IMS system discussed above, the overall voltage is such than the (fast, highly mobile) reactant ion $Cl^-$ takes 10 ms to traverse a 4.0 cm long drift region (speed 4.0 cm/0.01 s=400 cm/s) and that this electrical field constitutes the mean slope through the shutter and drift regions of the tube. This voltage gradient is approximately 120 V/cm. If S1 and S2 are 0.1 cm apart, ions require 0.1×10 ms/4 cm=250 μs to cross the shutter if Vs1 lies on the mean slope. From the closed position, where there are no ions between S1 and S2, an electrical pulse 500 μs long allows filling of the S1-S2 space for 250 μs, then allows ions to flow past S2 for 250 μs, then closes. As a result, in this example, the number of ions that have passed causes a detection limit signal of 3000 ions.

The novel ion detection device discussed with regard to FIG. 3, can be constructed in one embodiment, in which such that S1 and S2 are separated by 0.3 cm and Vg1, Vg2, and the open-position Vs1 are raised to values putting them on the mean slope line again present in the drift region. Vs1 must be 0.3 cm×120 V/cm=36V higher than Vs2 to lie on the mean slope line. At a hypothetical time zero, ions are allowed to flow between S1 and S2. It requires 3×250=750 μs to fill the space because the space is now 3 times as long as the space in the conventional IMS, and 3×3000=9000 ions are in the space. At time 750 μs, Vs1 is raised sufficiently to cause the voltage slope from S1 to S2 to triple from 120 V/cm to 360 V/cm, or from 36 V to 108 V higher (in absolute value) than V2.

Under these conditions, an ion of average mobility passes out of the S1-S2 space in another 0.3 cm/(3×400 cm/s)=250 μs. A packet of ions enters the drift region of the novel system in the same period as in the conventional apparatus, but is three times as concentrated (i.e., "compressed"), so the detection limit (minimum number of ions necessary to identify the ions) of the ion detection device according to this embodiment for any ion of interest is three times smaller than for an otherwise similar conventional instrument.

The voltages discussed above to be applied to S1 and S2 are applied by the voltage source 19 and the timing of applying the voltages is determined by the control unit 21 based on user input or based on a prestored table that takes into account the type of ions to be detected, the distance between the S1 and S2, and other characteristics of the device, as for example the available voltage or the sensitivity of the ion detection element. Alternatively, the control unit 21 includes a microprocessor that is programmed to determine each of Vs1 and Vs2 based on software instructions.

"Compression" is described in more detail as follows: The S1-S2 volume (length delta Z) is initially filled with a packet of length delta Z of the fastest ions and with shorter packets of all slower ions, with the length of each packet proportional to the electrophoretic mobility of that species; slower ions move a shorter distance into this space during any given period. During the compression phase, all packets move rapidly toward S2 due to the high electric field between S1 and S2. In this respect, it is noted that conventional devices have the voltage at S1 lower than the voltage at S2 to achieve a closing of the shutter, so ions in the space S1-S2 are expelled towards the left or removed, contrary to the ion detection device of this embodiment. In contrast, in the ion detection device of this embodiment, ions to the left of S1 are removed, to provide a stoppage of the beam, at the same time that ions in the space between S1 and S2 are compressed in preparation for detection. As the leading edge (migration front) passes S2, the ions experience a more or less abruptly lower electrical field and slow down. The trailing portion of the packet continues to move rapidly and partially catches up with the leading edge until the entire packet has passed S2. If few ions collide with the screen S2, the ion flux is conserved, i.e., as the velocity of the packet decreases, its density must increase. Between S1 and S2, the velocity is high and the density of the packet is low, so after it passes S2, where the velocity is low, the density must be high. This happens when the packet of ions is compressed to a smaller length. There is no expansion or dilation in the radial direction except expansion due to gaseous diffusion and, to a much smaller degree, mutual ionic repulsion.

Additional compression may be achieved via a further increase in the voltage difference between S1 and S2. Additional resolution results from the additional time compression due to additional slope increases, and additional instrumental sensitivity results from additional lengthening of the S1-S2 distance with a concomitant increase in voltage slope between S1 and S2. There is a limit to the slope possible between S1 and S2 before ions enter the "high voltage regime" where ions are heated by collisions with gas molecules and unusual and/or unexpected chemical reactions occur. Based on the behavior of the ion chemistry in the detection system, advantage could be taken of the additional compression available in this regime. The transition to the high voltage regime occurs near 1500 V/cm under ambient conditions.

Both the ion beam compression and the required shuttering action may be achieved via a number of arrangements of electrodes and voltages as will be discussed in the following embodiments. In the first arrangement, two shutter elements as shown in FIG. 3 are given a substantially larger than conventional separation, and one shutter element is driven to tow or three different voltage values. In the second arrangement, three shutter elements are used and the pair of shutter elements closest to the ionizer creates the shutter action, and the pair closest to the drift region simultaneously creates the compression action. The pair of shutter elements closest to the drift region is given a substantially larger than conventional separation. In the third arrangement, a fourth shutter element is added for the purpose of neutralization of the most mobile ions and electrons before they reach the drift region. Each embodiment is discussed next in more details.

Two-Screen Three-Phase Ion Detection Device

Figure 6A:
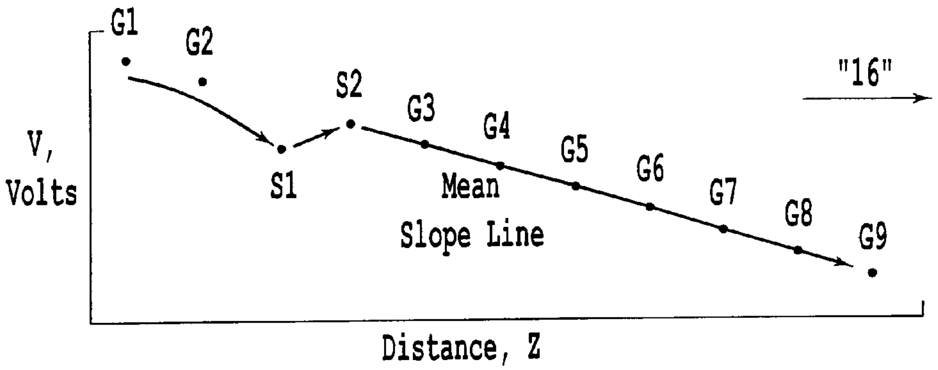
FIGS. 6A*a*-C are graphs of potential (V, Volts) vs. distance (Z, cm) for a schematic IMS device containing a two screen IBS of the type described in one embodiment of this invention, operated at three voltages corresponding to the Close, Accumulation, and Compression phases of operation.
Figure 6B:
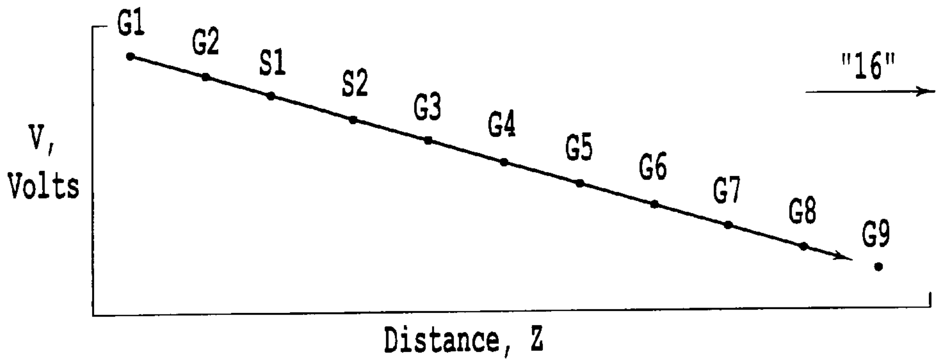
Figure 6C:
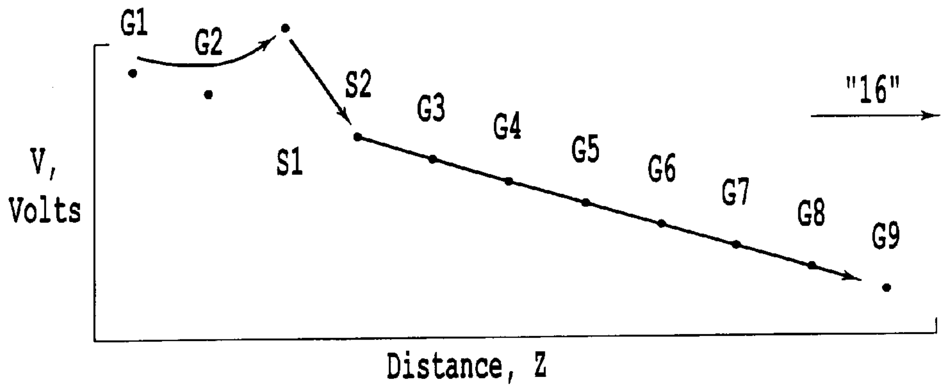

According to this embodiment, the ion detection device has three shutter elements 12-1 to 12-3 that are identical or different and of the same type to those discussed in regard to FIG. 3. Three voltage levels are applied sequentially to S1. These levels correspond to a lowered voltage "closed phase" where Vs1<Vs2 (FIG. 6A), an intermediate voltage "accumulation phase" where ions flow into the space between S1 and S2 (FIG. 6B), and a higher voltage "compression phase" (FIG. 6C).

The system is allowed to equilibrate in the closed phase for 20-1000 ms. The shortest useful equilibration time corresponds to the clearance of the slowest observable ions from the drift region so they do not interfere with subsequent analyses. Longer times may be required for external data processing.

At the beginning of an analysis cycle, Vs1 is raised to the accumulation phase voltage to allow ions to flow into the S1-S2 space. This phase preferably lasts no longer than the time required for the fastest ions, typically a reactant ion, to cross the S1-S2 space, approximately 1 ms in one exemplary embodiment. Electrophoretic separation of ions begins at the start of the accumulation phase. If the accumulation phase is continued beyond the time where the fastest ions of interest pass S2, some portion of the packets of the fastest ions will have passed S2 and not be compressed, and leading ramps will appear on detected ion peaks.

At the beginning of the compression phase, Vs1 is raised to increase the electrical field between S1 and S2 to a relatively high value. The packet of ions accumulated in the S1-S2 space moves rapidly toward S2. Electrophoretic separation of ions continues during this phase. The compression phase preferably ends when the slowest ions observable have passed S2, and before the fastest observable ions have reached the detector. This period is perhaps 0.5 ms according to another embodiment. Alternatively, the compression phase lasts until all observable ions have reached the detector (and have been cleared from the drift region). The objective of these alternative timing schemes is to prevent electrical impulses from operation of the shutter from interfering with detection.

Alternatively, the compression phase could be shortened so no slow ions (especially those of no interest) pass S2 before Vs1 is lowered at the end of the compression phase. These slow ions flow back to S1 and are neutralized during subsequent equilibration.

Finally, Vs1 is returned to the closed phase voltage and the system is allowed to re-equilibrate. Ions in packets created by the shutter continue electrophoretic motion and separation as they flow toward the detector. If the alternative shorter compression phase timing is used, equilibration can occur during the drift time of ions of interest, resulting in an overall decrease in required analytical cycle time.

Unless Vs1 is much higher than Vg2 (and higher than Vg1, depending on the voltages, separations, and diameters of the drift rings and screens) during the compression phase, ions continue to pass S1 and continue toward the detector according to this embodiment. This is a "leakage" and causes tailing of the detected ion peaks and a subsequent loss of peak resolution. If Vs1 is much higher than Vg2 (perhaps of the magnitude of Vg1), however, the concentration of ions in the vicinity of G1 and G2 will be lowered because they move radially to the annulus of G2 and are neutralized, and a loss of sensitivity occurs unless additional time is allowed in the closed phase to allow recovery. Shutter leakage is undesirable if the system uses an integrating ion detector, because the leakage causes the integral of the ion current to increase continuously toward the upper limit of the detector. The leakage may be acceptable if a current-sensing detector is used.

In one embodiment, an IMS system for analysis of negative ions, was constructed with S1 and S2 separated by 0.3 cm. The system was at rest in the closed position (Vs1=−471V, Vs2=−476V). At time zero, Vs1 was raised to −486V (accumulation), was held there for 750 μs, was then raised to the −535V (compression) for an additional 750 μs, then was returned to the closed voltage. This system was observed to completely interrupt the ion beam, and release pulses of ions.

Three-Screen Two-Phase Ion Detection Device

Figure 7:
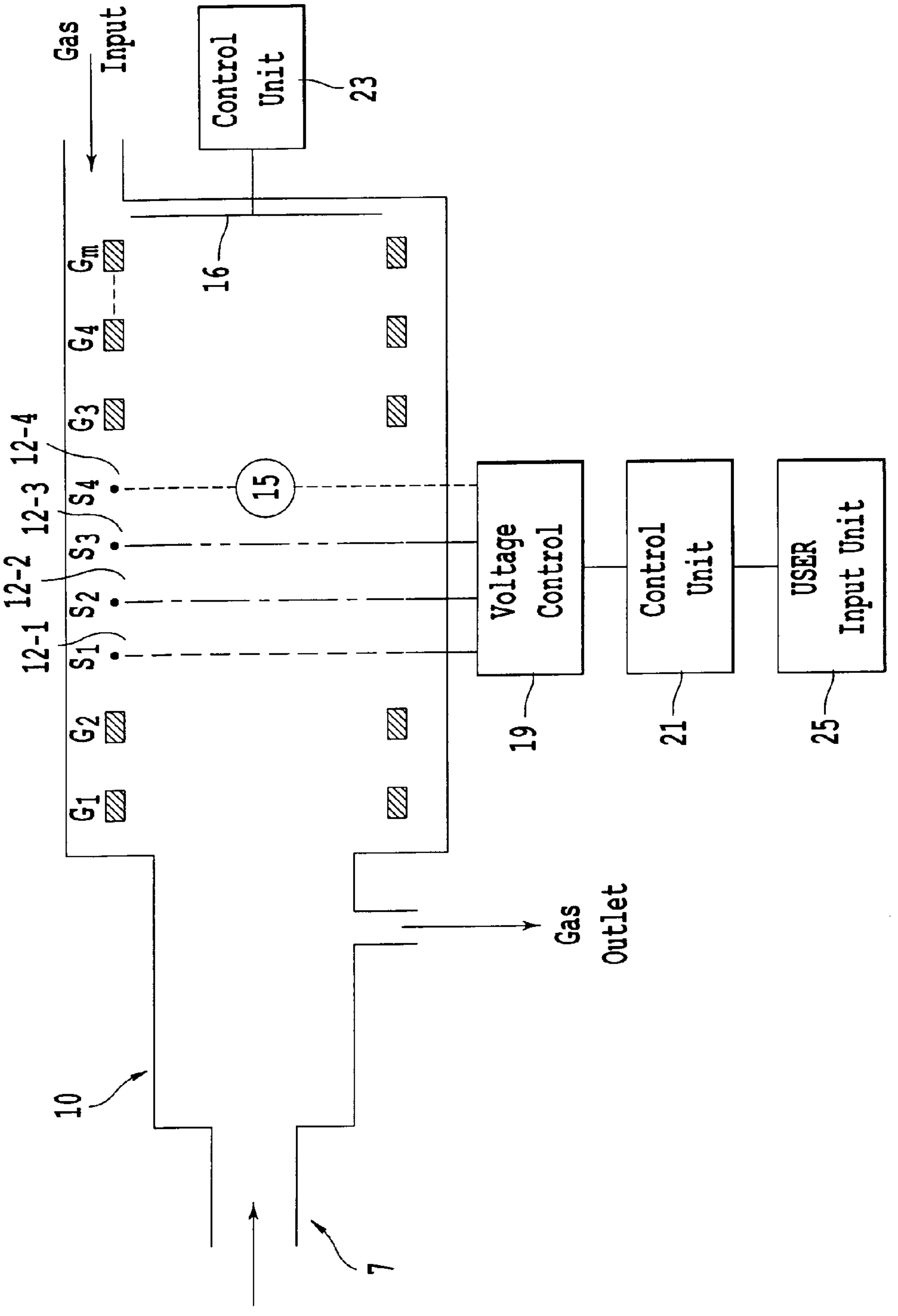
FIG. 7 is a schematic diagram of an ion detection device according to an embodiment of the present invention.

To improve the performance of the ion detection device discussed above, a third screen can be either substituted for G2, or inserted in the tube between G2 and the previously present elements. FIG. 7 shows the ion detecting device according to this embodiment having three shutter elements 12-1 to 12-3, that correspond to S1 to S3. FIG. 7 also shows the guard rings G1 to Gn, where n is an integer having a value between 0 and 55. In one embodiment, no guard rings are provided. Thus, a "pusher" electrode that pushes the ions from the ionizing region to the drift region. This ion detection device uses a simpler control circuit than the three-phase device discussed above. It is convenient to picture the reaction region, the shutter region and the drift regions to have voltages adjusted to provide a mean slope line of voltages with the electrode voltages lying on the line. However, it is not necessary to use linear voltage gradients and this embodiment uses linear voltage gradients for illustrative purposes. When the shutter is open, the voltages preferably form a monotonically decreasing series that causes ions to flow toward the detector.

Figure 8A:
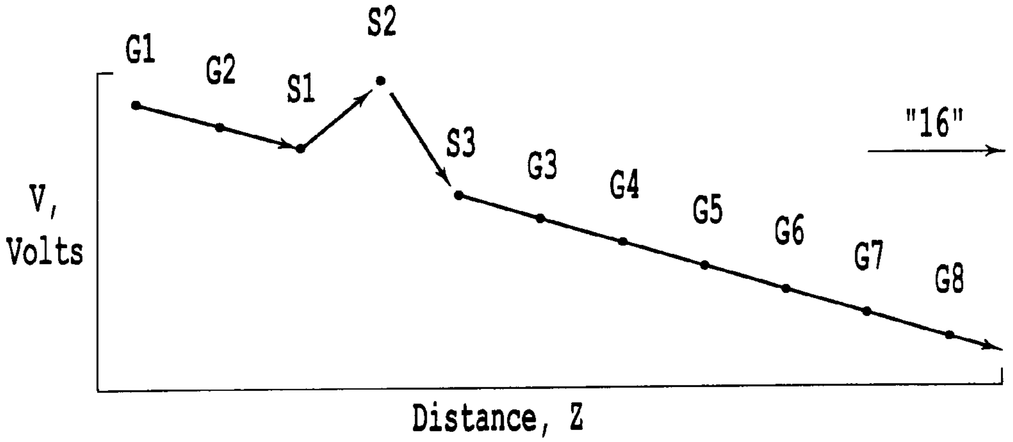
FIGS. 8A and 8B are graphs of potential (V, Volts) vs. distance (Z, cm) for a schematic IMS device containing a three screen IBS of the type described in one embodiment of this invention, operated at two voltages corresponding to the Compression/Closed, and the Accumulation phases of operation.
Figure 8B:
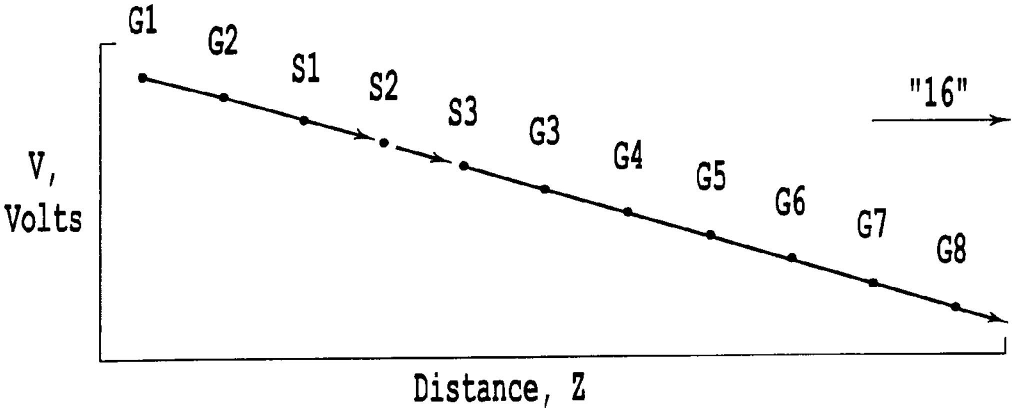

Both the shutter function and the ion-beam compression function are achieved via control of Vs2. As shown in FIG. 7, each of S1 to S3 is independently controlled by the control unit 21 via the voltage source 19. Optionally, a user input unit 25 is provided to input timings and voltages to the control unit 21 or the control unit is programmed to determine itself the timings and the voltages to be applied for determining a certain type of ions. Vs1 and Vs3 remain substantially constant. Vs2 is held at two voltage levels corresponding to a compression phase illustrated in FIG. 8A, similar to that described in FIG. 6C, and an accumulation phase illustrated in FIG. 8B, similar to that described in FIG. 6B. The alternative compression phase timings described in FIGS. 4B and 4C are applicable in one embodiment; slow ions can be eliminated between S1 and S2 when Vs2 is raised.

The ion detection device is allowed to equilibrate for, e.g., 20-1000 ms for the same reasons as discussed above. During this time, Vs2 remains at the compression phase voltage level, and is preferably constant, to avoid interference with detection of ions. Because Vs2>Vs1 during this period, ions cannot flow toward the detector from the reaction region and the shutter is closed to additional ions during this phase.

At the start of an analysis cycle, Vs2 is lowered to place the electrode voltage on or near the mean slope line to begin the accumulation phase. In this embodiment, ions first flow from S1 to S2, then on toward S3 before the end of the accumulation phase. Electrophoretic separation begins at this time. The length of this time may be shortened by construction of the tube so the distance between S1 and S2 is small, 0.5 mm in one embodiment, if efficient conductive screens are used, the consequently large voltage gradient between S2 and S1 in the compression phase will not disturb the populations of ions in the reaction region. (This lack of disturbance results in a reduced re-equilibration time.)

Finally, Vs2 is raised to a high value to generate a voltage gradient that starts the combined compression/equilibration phase. Ion packets accumulated in the S2-S3 space are compressed as described above. This phase lasts long enough, in one embodiment 500 μs, to allow all observable ions to clear the drift region, because it is identical with the equilibration time. No additional time is required to re-equilibrate the reaction region.

Two IMS systems, one constructed as a Two-Screen Three-Phase device as shown in FIG. 3, and one constructed as a Three-Screen Two-Phase device, as shown in FIG. 7, are compared next.

In the Two-Screen Three-Phase system, the distance between S1 and S2 may be 0.3 cm in one embodiment. The accumulation phase is started by application of a voltage to S1 to raise S1 from about 5 volts below S2 to 36 volts above S2. At the given electrophoretic speed of 400 cm/s, $Cl^-$ ions will cross from S1 to S2 in 750 μs, so the accumulation phase voltage is held for 750 μs. The compression phase is started by application of a voltage to S1 to raise it from 36 V above S2 to 108 V above S2. The compression phase lasts 250 μs whereupon Vs1 is returned to perhaps 5V below S2 to close the shutter and begin equilibration. This three-phase process creates packets of ions nominally 250 μs wide (shorter for slower ions), which are then separated by electrophoresis and proceed to the detector. Comparison with the conventional operation of a conventional T-P IBS shows a three-fold improvement of ion detection limits for ions analyzed using this IBS.

If Vs1 is instead raised to 216 volts above S2 (still in the low voltage regime), packets of ions are, instead, 125 μs wide (shorter for slower ions). This represents a possible doubling of the resolution of the device of this embodiment. It also represents a six-fold increase in the current maximum of the peak, and both current-sensing and integrating detectors will see an increase in signal-to-noise of six-fold. Additional increases may be realized by changes in the separations of the electrodes and in the compression voltage.

In the Three-Screen Three-Phase system, the distance between S1 and S2 may be 0.1 cm and the distance from S2 to S3 may be 0.3 cm, for example according to one embodiment. At the given electrophoretic speed of 400 cm/s, $Cl^-$ ions will cross from S1 to S2 in 250 μs, and from S2 to S3 in 750 μs. The accumulation phase is begun and Vs2 is adjusted from 108 V above Vs3 to only 36 V above Vs3. The compression phase is begun 1000 μs later when Vs2 is returned to 108 V above Vs3 (all in absolute value, again). This process creates packets of ions nominally 250 μs wide (shorter for slower ions), which are then separated by electrophoresis and proceed to the detector. Comparison with the conventional operation of a conventional T-P IBS again shows a three-fold improvement ion detection limits for ions analyzed using device of this embodiment.

Again, if Vs2 is raised to 216 volts above Vs3, a six-fold increase in signal-to-noise is realized. Additional increases may be realized by changes in the separations of the electrodes and in the compression voltage.

In another embodiment, an IMS system for analysis of negative ion was constructed with S1 and S2 separated by 0.3 cm and S2 and S3 separated by 0.3 cm. The system was at rest in the closed position (Vs1=−497V, Vs2=−471V, Vs3=−476V). At time zero, Vs2 was raised to −486V (accumulation), was held there for 2300 μs, was then raised to the −535V (compression) for an additional 750 μs, and finally was returned to the closed voltage. This system was observed to completely interrupt the ion beam, and release pulses of ions. At the detector, these pulses were 1600 μs full width at half height. Conventional operation of a drift tube of this size produces pulses approximately twice as wide as the shutter open time. This tube operated under the above described conditions produced a pulse shorter than the open time of the shutter, indicating that compression occurred.

Four-Screen Three-Phase Device

Both the Two-Screen and Three-Screen devices above give control over the arrival of less mobile ions at the detector by providing a means for neutralization of the less mobile ions within the shutter structure. The addition of a fourth screen shown in FIG. 7 as S4, provides a means for neutralization of the most mobile ions. The most mobile ions in IMS are usually reactant ions and/or electrons as $Cl^-$, $O_2^-$, $e^-$, $N_2^-$ present in large concentration relative to the analyte. If the detector is put into saturation by these species, the dynamic range will be compromised in the system because either a) detector gain must be reduced, or b) the total number of ions in a packet must be reduced.

A second reason to reduce the number of more mobile ions and electrons that reach the detector is that these ions transfer charge to low-concentration ionizable species present in the drift gas. These species move to the detector as a very long packet and result in a continuous current of various ions. This is particularly true of electrons and the effect is seen as a large background current between the time of the shutter operation and the time of arrival of the first ions admitted by the shutter. The same kind of decaying background current can be observed following the $Cl^-$ peak in negative ion IMS. Two remedies are available; a) clean the drift tube and maintain a flow of ultra-clean drift gas, and b) assure that large concentrations of reactive ions and/or electrons do not flow into the drift region. The former remedy severely limits the possibility of rapid startup of an IMS from a storage condition. The latter requires a more sophisticated shutter design than conventionally utilized.

Figure 9A:
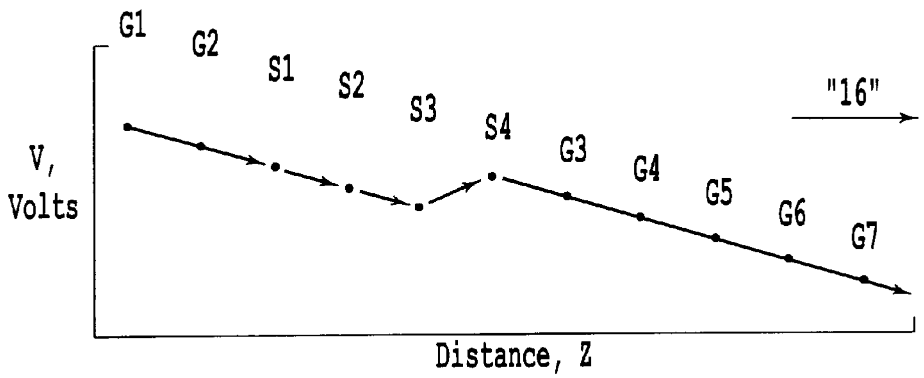
FIGS. 9A-C are graphs of potential (V, Volts) vs. distance (Z, cm) for a schematic IMS device containing a four screen IBS of the type described in one embodiment of this invention, operated at three sets of voltages corresponding to the Closed/Accumulation, the Compression/Closed to Fast Ions, and the Compression/Open to Slow Ions phases of operation.
Figure 9B:
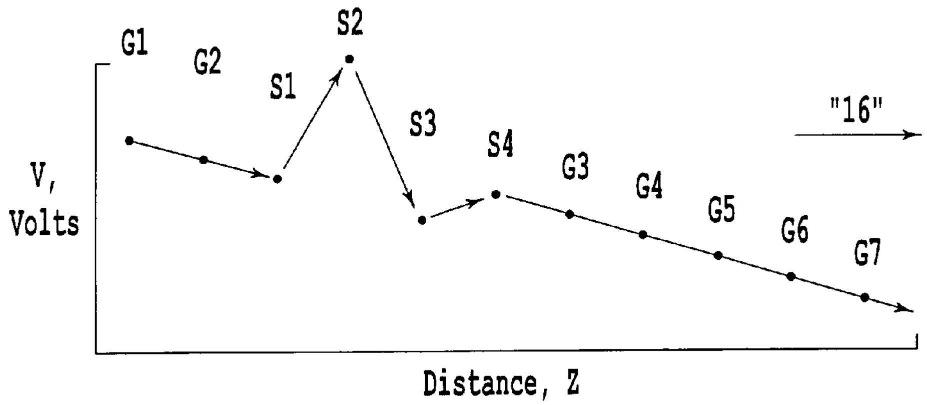
Figure 9C:
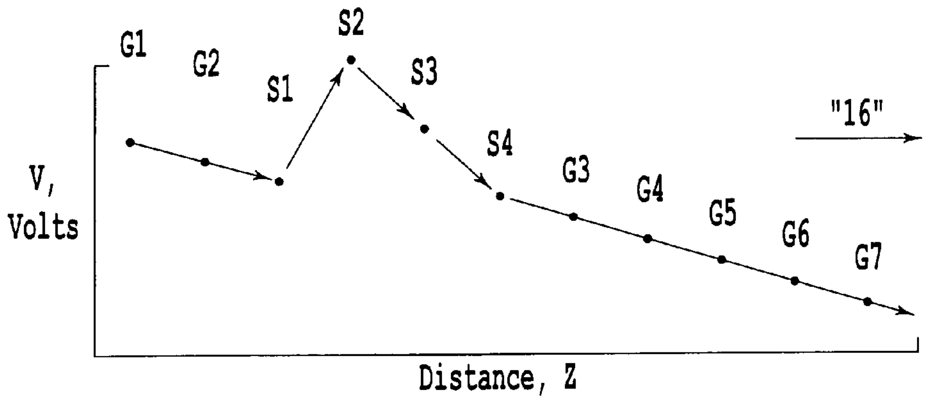

FIGS. 9A-C show a shutter operation sequence which, according to this embodiment, provides for closure of the shutter to all ions between screens S3 and S4 in the "closed and accumulation" state (FIG. 9A) and between S1 and S2 in the "compression and open to slow ions" state (FIG. 9C). The four screens are arranged using the considerations above.

In this embodiment, shown in FIGS. 9A-C, the mean slope line for electrodes G1, G2, S1, S2, and S3 lies below that of electrodes S4, G3, . . . , Gn. The two mean slope lines need not be either lines or parallel lines, or parallel curves. In this embodiment the voltages applied to the guard rings and the S1-S3 elements are such that Vg2>Vs1>Vs2>Vs3<Vs4 so ions flow to screen S3 and are neutralized there when the shutter system is in the "closed and accumulation" phase. A steady state concentration of ions is "accumulated" between S2 and S3 and no ions are present between S3 and S4.

To begin a shutter operation, Vs2 is raised sufficiently to compress the ions accumulated between S2 and S3 and to close the shutter to all ions at S1. Electrophoretic separation begins during this phase. All ions begin to rapidly move toward S3. The more mobile ions (and electrons in the case of negative ion analysis) reach S3 soonest and begin to be neutralized there.

When all the undesired highly mobile ions have been neutralized at S3, slower ions have been selected by the process and remain in the space between S2 and S3. The next phase begins when Vs3 is raised so that Vs2>Vs3>Vs4. Ions continue to flow between S2 and S3, and then from S3 to S4 and on to the drift region. Compression of these selected ions into tighter packets occurs.

Finally, Vs2 and Vs3 are returned to their "closed and accumulation" phase values. A second selection process, can be executed by returning Vs3 (preferably both Vs3 and Vs2) to the "closed and accumulation" phase values before the slowest observable ions have passed S4. The slowest ions are thus returned to S3 and neutralized.

Alternative Four-Screen Three-Phase Device

In this embodiment, the device is held at rest as in FIG. 9C, with Vs2>Vs1, and Vs3 could be any value because no ions are flowing.

Operation of the shutter is identical with that in the Four-Screen Three-Phase method, with the exception that the voltages must be held in the "closed and accumulation" phase shown in FIG. 9A long enough to preferably fill the space between S2 and S3 with a steady state concentration of ions.

Four-Screen Two-Phase Device

Simplification of operation can be achieved in this embodiment by an elimination of the "compression and closed to fast ions" phase. When the shutter is changed from closed to accumulate, electrons and/or high mobility ions move rapidly from S2 to S3. The shutter would be allowed to equilibrate in the "compression and open slow ions" phase (FIG. 9C). A shutter operation would begin with adjustment of Vs2 and Vs3 to the "closed and accumulation" phase. Electrons and/or high mobility ions would be neutralized at S3 during this phase. Finally, Vs2 and Vs3 would be adjusted back to the condition shown in FIG. 9C as "compression and open to slow ions".

This embodiment has the advantage that it is not necessary to change any of the shutter voltages during the drift time. Such changes could appear as noise and interfere with ion detection. It has the disadvantage not being able to select both high and low thresholds for ion mobility. In a dedicated instrument, however, voltage and separation adjustments may allow optimization for a particular analyte while using a simpler electronic switch than required for the other Four-Screen devices.

In all the Four-Screen devices, the ions accumulated between screens S2 and S3 are selected for compression and detection. To achieve the maximum ion packet compression, the distance from S2 to S3 is preferably as long as practicable, and the distances from S1 to S2 and from S3 to S4 are preferably as short as practicable. Although this increases the optimum voltage difference between S2 and S3, it reduces the required voltage difference between S3 and S4. The resulting large gradient between S1 and S2 might put this region into the "high voltage regime" but this is of no consequence as no ions are detected which experience the high fields there.

Four-Screen Numerical Example

A drift tube having the general properties given above is used. The distance from S2 to S3 is 0.3 cm, from S1 to S2 is 0.1 cm, and from S3 and S4 is 0.1 cm. The mobility of electrons is approximately 1000 times greater than that of any ion. As a result, electrons can be neutralized and not admitted to the drift region by maintaining Vs3 below Vs4 for approximately one 1 μs. (For electrons, Vs2 need only be a few volts below Vs4). Limitations of electronic circuitry may result in extension of this time to 100 μs. This is not long compared with the 750 μs necessary for a fast ion such as $Cl^-$ to travel the 0.3 cm between S2 and S3, but the slow circuitry may complicate numerical modeling of the system behavior.

According to one embodiment, the voltage between S2 and S3 is 36V and that between S3 and S4 is 12V when all electrodes lie on the mean slope line. To compress the $Cl^-$ ion packet to 250 μs in length, S2 must be raised to an average value (some of the time S3 is below S4) of (0.3+0.1 cm)*3*120 V/cm=144 V above S4. Because only ions accumulated between S2 and S3 are compressed and detected, 9000 ions arrive in a packet at the detector, compared with only 3000 ions from a conventional TP-IBS. Without reaching the "high voltage regime," Vs2 could readily be raised to 256V above Vs4, giving a packet 125 μs in length containing 9000 ions, or a current maximum six-fold larger than for the conventional TP-IBS. Further improvements could be attained by increases in the separation S2 to S3 and/or the difference V2-V4 (in absolute value) during the accumulation phase.

According to another embodiment, the pulse width in the Four-Screen Three-Phase system, when Vs2 is 144V above Vs4 (three-fold increase in ion peak current and no change in resolution), will be approximately (0.3+0.1 cm)/400 cm/s/3=333 μs. In the Alternative Four-Screen Three-Phase method, the pulse width will be (0.1+0.3 cm)/400 cm/s=1000 μs, but the resultant ion peak will also be three-fold larger than in a conventional T-P IBS with 0.1 cm separation.

If, however, Vs2 is 256V above Vs4 in the compression phase, the required pulse widths will be 333/2=156 μs for the Four-Screen Three-Phase method and 1000 μs for the Alternative Four-Screen Three-Phase method.

It should be apparent that there are many modifications possible with this invention, as long as the concept of using large potential gradient between two conductive screens to compress a pulse of ions into a shorter pulse is followed. For example, operation of the shutter could comprise a partial interruption of the ion flow, rather than a complete "closure" of ion flow, followed by a compression phase. This type of operation would be suitable for a current-sensitive detector and instrument sensitivity would benefit from the compression feature. Another example is the use of the compressing ion beam shutter with various gases at various pressures within the drift tube. It is intended that the scope of the invention be defined by the appended claims.

Figure 10:
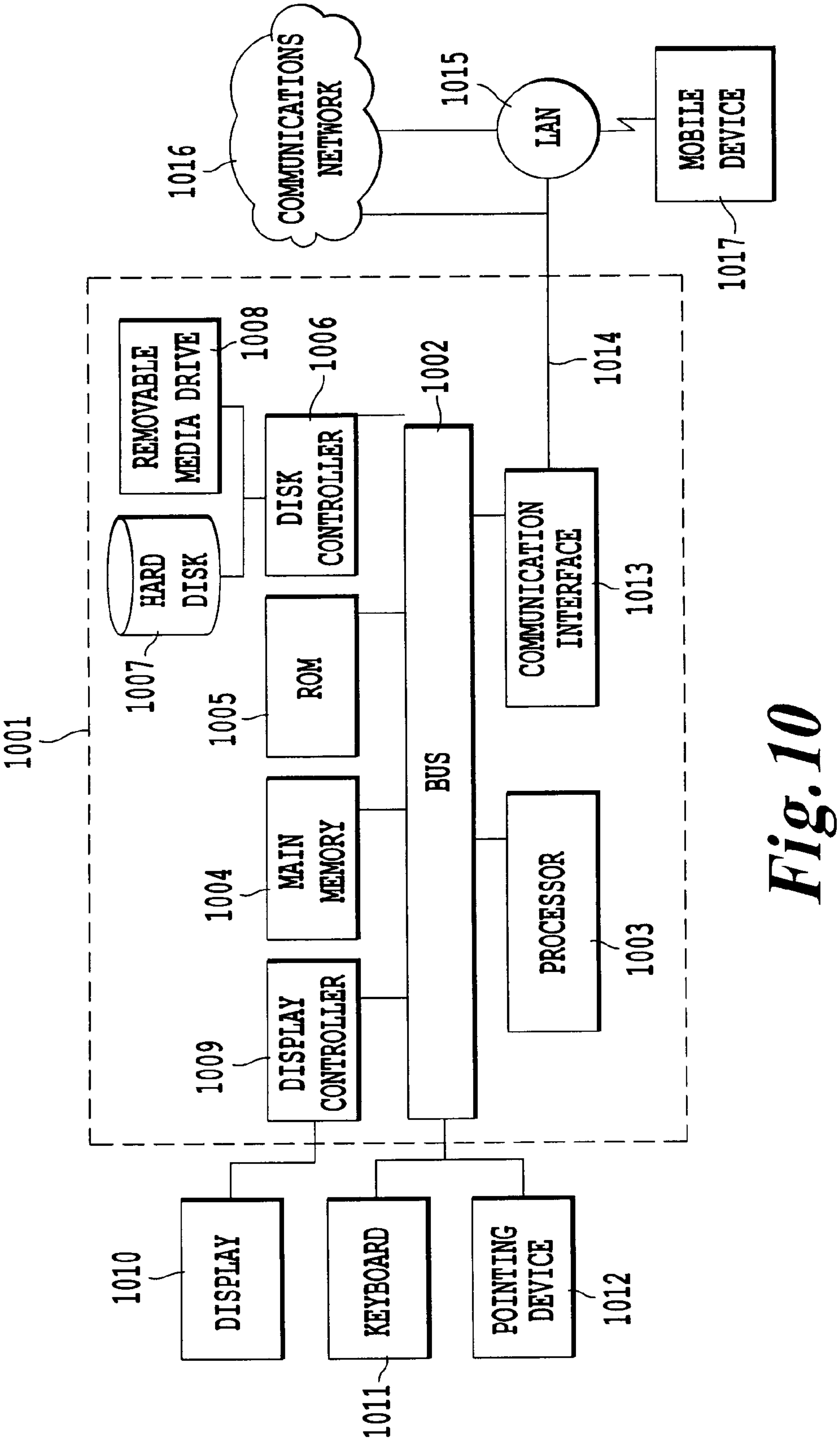
FIG. 10 is a schematic diagram of a computer system upon which an embodiment of the present invention may be implemented.

FIG. 10 illustrates a computer system 1001 upon which an embodiment of the present invention may be implemented. The computer system 1001 includes a bus 1002 or other communication mechanism for communicating information, and a processor 1003 coupled with the bus 1002 for processing the information. The computer system 1001 also includes a main memory 1004, such as a random access memory (RAM) or other dynamic storage device (e.g., dynamic RAM (DRAM), static RAM (SRAM), and synchronous DRAM (SDRAM)), coupled to the bus 1002 for storing information and instructions to be executed by processor 1003. In addition, the main memory 1004 may be used for storing temporary variables or other intermediate information during the execution of instructions by the processor 1003. The computer system 1001 further includes a read only memory (ROM) 1005 or other static storage device (e.g., programmable ROM (PROM), erasable PROM (EPROM), and electrically erasable PROM (EEPROM)) coupled to the bus 1002 for storing static information and instructions for the processor 1003.

The computer system 1001 also includes a disk controller 1006 coupled to the bus 1002 to control one or more storage devices for storing information and instructions, such as a magnetic hard disk 1007, and a removable media drive 1008 (e.g., floppy disk drive, read-only compact disc drive, read/write compact disc drive, compact disc jukebox, tape drive, and removable magneto-optical drive). The storage devices may be added to the computer system 1001 using an appropriate device interface (e.g., small computer system interface (SCSI), integrated device electronics (IDE), enhanced-IDE (E-IDE), direct memory access (DMA), or ultra-DMA).

The computer system 1001 may also include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs)).

The computer system 1001 may also include a display controller 1009 coupled to the bus 1002 to control a display 1010, such as a cathode ray tube (CRT), for displaying information to a computer user. The computer system includes input devices, such as a keyboard 1011 and a pointing device 1012, for interacting with a computer user and providing information to the processor 1003. The pointing device 1012, for example, may be a mouse, a trackball, or a pointing stick for communicating direction information and command selections to the processor 1003 and for controlling cursor movement on the display 1010. In addition, a printer may provide printed listings of data stored and/or generated by the computer system 1001.

The computer system 1001 performs a portion or all of the processing steps of the invention in response to the processor 1003 executing one or more sequences of one or more instructions contained in a memory, such as the main memory 1004. Such instructions may be read into the main memory 1004 from another computer readable medium, such as a hard disk 1007 or a removable media drive 1008. One or more processors in a multi-processing arrangement may also be employed to execute the sequences of instructions contained in main memory 1004. In alternative embodiments, hard-wired circuitry may be used in place of or in combination with software instructions. Thus, embodiments are not limited to any specific combination of hardware circuitry and software.

As stated above, the computer system 1001 includes at least one computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the computer system 1001, for driving a device or devices for implementing the invention, and for enabling the computer system 1001 to interact with a human user (e.g., print production personnel). Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor 1003 for execution. A computer readable medium may take many forms, including but not limited to, non-volatile media, volatile media, and transmission media. Non-volatile media includes, for example, optical, magnetic disks, and magneto-optical disks, such as the hard disk 1007 or the removable media drive 1008. Volatile media includes dynamic memory, such as the main memory 1004. Transmission media includes coaxial cables, copper wire and fiber optics, including the wires that make up the bus 1002. Transmission media also may also take the form of acoustic or light waves, such as those generated during radio wave and infrared data communications.

Various forms of computer readable media may be involved in carrying out one or more sequences of one or more instructions to processor 1003 for execution. For example, the instructions may initially be carried on a magnetic disk of a remote computer. The remote computer can load the instructions for implementing all or a portion of the present invention remotely into a dynamic memory and send the instructions over a telephone line using a modem. A modem local to the computer system 1001 may receive the data on the telephone line and use an infrared transmitter to convert the data to an infrared signal. An infrared detector coupled to the bus 1002 can receive the data carried in the infrared signal and place the data on the bus 1002. The bus 1002 carries the data to the main memory 1004, from which the processor 1003 retrieves and executes the instructions. The instructions received by the main memory 1004 may optionally be stored on storage device 1007 or 1008 either before or after execution by processor 1003.

The computer system 1001 may also include a communication interface 1013 coupled to the bus 1002. The communication interface 1013 provides a two-way data communication coupling to a network link 1014 that is connected to, for example, a local area network (LAN) 1015, or to another communications network 1016 such as the Internet. For example, the communication interface 1013 may be a network interface card to attach to any packet switched LAN. As another example, the communication interface 1013 may be an asymmetrical digital subscriber line (ADSL) card, an integrated services digital network (ISDN) card or a modem to provide a data communication connection to a corresponding type of communications line. Wireless links may also be implemented. In any such implementation, the communication interface 1013 sends and receives electrical, electromagnetic or optical signals that carry digital data streams representing various types of information.

The network link 1014 typically provides data communication through one or more networks to other data devices. For example, the network link 1014 may provide a connection to another computer through a local network 1015 (e.g., a LAN) or through equipment operated by a service provider, which provides communication services through a communications network 1016. The local network 1014 and the communications network 1016 use, for example, electrical, electromagnetic, or optical signals that carry digital data streams, and the associated physical layer (e.g., CAT 5 cable, coaxial cable, optical fiber, etc). The signals through the various networks and the signals on the network link 1014 and through the communication interface 1013, which carry the digital data to and from the computer system 1001 maybe implemented in baseband signals, or carrier wave based signals. The baseband signals convey the digital data as unmodulated electrical pulses that are descriptive of a stream of digital data bits, where the term "bits" is to be construed broadly to mean symbol, where each symbol conveys at least one or more information bits. The digital data may also be used to modulate a carrier wave, such as with amplitude, phase and/or frequency shift keyed signals that are propagated over a conductive media, or transmitted as electromagnetic waves through a propagation medium. Thus, the digital data may be sent as unmodulated baseband data through a "wired" communication channel and/or sent within a predetermined frequency band, different than baseband, by modulating a carrier wave. The computer system 1001 can transmit and receive data, including program code, through the network(s) 1015 and 1016, the network link 1014 and the communication interface 1013. Moreover, the network link 1014 may provide a connection through a LAN 1015 to a mobile device 1017 such as a personal digital assistant (PDA) laptop computer, or cellular telephone.

Further, elements and/or features of different exemplary embodiments may be combined with each other and/or substituted for each other within the scope of this disclosure and appended claims.

In other embodiments, any one of the above-described and other exemplary features of the present invention are embodied in the form of an apparatus, method, system, computer readable medium. For example, the aforementioned methods are embodied in the form of a system or device, including, but not limited to, any of the structure for performing the methodology illustrated in the drawings.

One or more embodiments of the present invention are implemented using a conventional general purpose digital computer programmed according to the teachings of the present specification, as is apparent to those skilled in the computer art.

Appropriate software coding can readily be prepared by skilled programmers based on the teachings of the present disclosure, as is apparent to those skilled in the software art.

One or more embodiments of the present invention is implemented by the preparation of application specific integrated circuits or by interconnecting an appropriate network of conventional component circuits, as is readily apparent to those skilled in the art.

Any of the aforementioned methods may be embodied in the form of a system or device, including, but not limited to, any of the structure for performing the methodology illustrated in the drawings.

Furthermore, any of the aforementioned methods is embodied in the form of a program. The program is stored on a computer readable media and is adapted to perform any one of the aforementioned methods when running on a computer device (a device including a processor). Thus, the storage medium or computer readable medium, is adapted to store information and is adapted to interact with a data processing facility or computer device to perform the method of any of the above mentioned embodiments.

In one embodiment, the storage medium is a built-in medium installed inside a computer device main body or a removable medium arranged to be separated from the computer device main body. Examples of a built-in medium include, but are not limited to, rewriteable non-volatile memories, such as ROMs and flash memories, and hard disks. Examples of a removable medium include, but are not limited to, optical storage media such as CD-ROMs and DVDs; magneto-optical storage media, such as MOs; magnetism storage media, such as floppy disks (trademark), cassette tapes, and removable hard disks; media with a built-in rewriteable non-volatile memory, such as memory cards; and media with a built-in ROM, such as ROM cassettes.

Example embodiments being thus described, it will be obvious that the same may be varied in many ways. Such exemplary variations are not to be regarded as a departure from the spirit and scope of the present invention, and all such modifications as would be obvious to one skilled in the art are intended to be included within the scope of the following claims.

The number of constituent elements, locations, shapes and so forth of the constituent elements are not limited not limited to any of the structure for performing the methodology illustrated in the drawings.

The invention claimed is:

1. An ion detection device comprising:

a chamber having an inlet and configured to receive ions through the inlet;

a shutter provided in the chamber opposite the inlet and configured to allow or prevent the ions to pass the shutter, the shutter having first and second shutter elements;

a collector provided in the chamber opposite the shutter and configured to collect ions passed through the shutter;

a processing unit electrically connected to the first and second shutter elements and configured to apply, during a first predetermined time interval, a first voltage to the first shutter element and a second voltage to the second shutter element, the second voltage being lower than the first voltage such that ions from the inlet enter a volume defined by the first and second shutter elements, and during a second predetermined time interval, a third voltage to the first shutter element, higher than the first voltage, and a fourth voltage to the second shutter element, the third voltage being higher than the fourth voltage such that ions that entered the volume are compressed as the ions exit the volume and new ions coming from the inlet are prevented from entering the volume; and the processing unit being electrically coupled to the collector and configured to detect the compressed ions based at least on a current received from the collector and produced by the ions collected by the collector.

2. The ion detection device of claim 1, wherein the fourth voltage is equal to the second voltage.

3. The ion detection device of claim 1, wherein the voltage gradient between first and second shutter elements is two to ten times higher than the voltage gradient between the second shutter and the collector during the second predetermined time interval.

4. The ion detection device of claim 1, further comprising:
a first electrode provided inside the chamber, between the inlet and the first shutter element,
wherein the first shutter element is closer to the inlet than the second shutter element.

5. The ion detection device of claim 4, wherein the processing unit is configured to apply a fifth voltage to the first electrode.

6. The ion detection device of claim 5, wherein the fifth voltage is higher than the first voltage during the first predetermined time interval.

7. The ion detection device of claim 5, wherein the processing unit is configured to change the first voltage to the third voltage such that the third voltage is higher than the fifth voltage.

8. The ion detection device of claim 4, further comprising:
a second electrode provided inside the chamber, between the second shutter element and the collector.

9. The ion detection device of claim 8, wherein the processing unit is further configured to apply a sixth voltage to the second electrode that is less than the second voltage during the first predetermined time interval and less than the fourth voltage during the second predetermined time interval.

10. The ion detection device of claim 1, wherein the processing unit is further configured to apply a fifth voltage to the first shutter element and a sixth voltage to the second shutter element during a third predetermined time interval such that the ions from the inlet are prevented from entering the volume, and the fifth voltage is less than the first voltage and the sixth voltage is equal to the second and fourth voltages.

11. The ion detection device of claim 1, wherein the processing unit determines the compressed ions based on at least another parameter which is one of a time of arrival of the ions to the collector, a distance between the shutter and the collector, a voltage applied between the shutter and the collector, a temperature between the shutter and the collector, and a gas pressure between the shutter and the collector.

12. An ion detection device comprising:
a chamber having an inlet and configured to receive ions through the inlet;
a shutter provided in the chamber opposite the inlet and configured to allow or prevent the ions to pass the shutter, the shutter having first, second, and third shutter elements;
a collector provided in the chamber opposite the shutter and configured to collect ions passed through the shutter; and
a processing unit electrically connected to the first, second and third shutter elements and configured to apply
during a first predetermined time interval, a first voltage to the first shutter element, a second voltage to the second shutter element, and a third voltage to the third shutter element, the first, second and third voltages decreasing in this order such that ions from the inlet enter a volume defined by the second and third shutter elements, and
during a second predetermined time interval, a fourth voltage to the first shutter element, a fifth voltage to the second shutter element, higher than the second voltage, and a sixth voltage to the third shutter element such that ions that entered the volume are compressed by a voltage gradient between the second and third shutter elements as the ions exit the volume and new ions coming from the inlet are prevented from entering the volume by a voltage gradient between the first and second shutter elements; and
the processing unit being electrically coupled to the collector and configured to detect the compressed ions based at least on a current received from the collector and produced by the ions collected by the collector.

13. The ion detection device of claim 12, wherein the third voltage is equal to the sixth voltage.

14. The ion detection device of claim 12, wherein the first voltage is equal to the fourth voltage.

15. The ion detection device of claim 12, wherein the voltage gradient between second and third shutter elements is two to ten times higher than the voltage gradient between the third shutter element and the collector during the second predetermined time interval.

16. The ion detection device of claim 12, further comprising:
a first electrode provided inside the chamber, between the inlet and the first shutter element,
wherein the first shutter element is closest to the inlet and the third shutter element is farthest from the inlet.

17. The ion detection device of claim 16, wherein the processing unit is configured to apply a seventh voltage to the first electrode.

18. The ion detection device of claim 17, wherein the seven voltage is higher than the first voltage during the first predetermined time interval.

19. The ion detection device of claim 17, wherein the processing unit is configured to change the second voltage to the fifth voltage such that the fifth voltage is higher than the fourth voltage.

20. The ion detection device of claim 16, further comprising:
a second electrode provided inside the chamber, between the third shutter element and the collector.

21. The ion detection device of claim 20, wherein the processing unit is further configured to apply a seventh voltage to the second electrode that is less than the third voltage during the first predetermined time interval and less than the sixth voltage during the second predetermined time interval.

22. The ion detection device of claim 12, further comprising:
first and second electrodes in the chamber, the first electrode between the inlet and the first shutter element and the second electrode between the third shutter element and the collector,
the processing unit is further configured to apply during the first and second predetermined time intervals, a seventh voltage to the first electrode and an eighth voltage to the second electrode,
during the first predetermined time interval, the seventh voltage, the first voltage, the second voltage, the third voltage and the eighth voltage decrease in this order, and
during the second predetermined time interval, the seventh voltage, the fourth voltage, the sixth voltage and the eighth voltage decrease in this order and the fifth voltage is higher than any of the fourth voltage, the sixth voltage and the eighth voltage.

23. The ion detection device of claim 12, wherein the processing unit determines the compressed ions based on at least another parameter, which is one of a time of arrival of the ions to the collector, a distance between the shutter and the collector, a voltage applied between the shutter and the collector, a temperature between the shutter and the collector, and a gas pressure between the shutter and the collector.

24. An ion detection device comprising:

a chamber having an inlet and configured to receive ions through the inlet;

a shutter provided in the chamber opposite the inlet and configured to allow or prevent the ions to pass the shutter, the shutter having first, second, third, and fourth shutter elements;

a collector provided in the chamber opposite the shutter and configured to collect ions that passed through the shutter; and a processing unit electrically connected to first, second, third and fourth shutter elements and configured to apply during a first predetermined time interval, a first voltage to the first shutter element, a second voltage to the second shutter element, a third voltage to the third shutter element, and a fourth voltage to the fourth shutter element, the first, second, and third voltages decrease in this order and the fourth voltage is higher than the third voltage such that ions from the inlet enter a first volume defined by the second and third shutter elements, and ions are prevented from entering a second volume defined by the third and fourth shutter elements, during a second predetermined time interval, a fifth voltage to the first shutter element, a sixth voltage to the second shutter element, higher than the second voltage, a seventh voltage to the third shutter element, and an eighth voltage to the fourth shutter element such that ions that entered the first volume are accelerated inside the first volume and new ions coming from the inlet are prevented from entering the first volume, and during a third predetermined time interval, a ninth voltage to the first shutter element, a tenth voltage to the second shutter element, an eleventh voltage to the third shutter element, higher than the seventh voltage, and a twelfth voltage to the fourth shutter element such that the ions that entered the first volume are compressed as the ions exit the first volume and further compressed as the ions exit the second volume while the new ions coming from the inlet are prevented from entering the first volume; and the processing unit being electrically coupled to the collector and configured to detect the compressed ions based at least on a current received from the collector and produced by the ions collected by the collector.

25. The ion detection device of claim 24, wherein the first voltage, the fifth voltage and the ninth voltage are equal to each other.

26. The ion detection device of claim 24, wherein the fourth voltage, the eighth voltage and the twelfth voltage are equal to each other.

27. The ion detection device of claim 24, wherein the voltage gradient between the second and third shutter elements is two to ten times higher than the voltage gradient between the fourth shutter element and the collector during the second predetermined time interval.

28. The ion detection device of claim 24, further comprising:

a first electrode provided inside the chamber, between the inlet and the first shutter element, wherein the first shutter element is closest to the inlet and the fourth shutter element is farthest from the inlet.

29. The ion detection device of claim 28, wherein the processing unit is configured to apply a thirteenth voltage to the first electrode.

30. The ion detection device of claim 29, wherein the thirteenth voltage is higher than the first voltage during the first predetermined time interval.

31. The ion detection device of claim 29, wherein the processing unit is configured to change the second voltage to the sixth voltage such that the sixth voltage is higher than the fifth voltage.

32. The ion detection device of claim 28, further comprising:

a second electrode provided inside the chamber, between the fourth shutter element and the collector.

33. The ion detection device of claim 32, wherein the processing unit is further configured to apply a thirteenth voltage to the second electrode that is less than the fourth voltage during the first predetermined time interval, less than the eighth voltage during the second predetermined time interval, and less than the twelfth voltage during the third predetermined time interval.

34. The ion detection device of claim 24, further comprising:

first and second electrodes in the chamber, the first electrode between the inlet and the first shutter element and the second electrode between the fourth shutter element and a second end of the chamber, the processing unit is further configured to apply during the first, second, and third predetermined time intervals, a thirteenth voltage to the first electrode and a fourteenth voltage to the second electrode, during the first predetermined time interval, the thirteenth voltage, the first voltage, the second voltage, and the third voltage decrease in this order and the fourth voltage and the fourteenth voltage decrease in this order with the third voltage lower than the fourth voltage, during the second predetermined time interval, the sixth voltage is higher than the fifth voltage and the seventh voltage is lower than the eighth voltage, and during the third predetermined time interval, the tenth voltage is higher that the ninth and eleventh voltages, and the eleventh voltage, the twelfth voltage and the fourteenth voltage decrease in this order.

35. The ion detection device of claim 24, wherein the processing unit determines the compressed ions based on at least another parameter which is one of a time of arrival of the ions to the collector, a distance between the shutter and the collector, a voltage applied between the shutter and the collector, a temperature between the shutter and the collector, and a pressure between the shutter and the collector.

36. A method for detecting ions in an ion detection device having first and second shutter elements provided in a chamber, the first shutter element facing an inlet and the shutter facing a collector that collects ions passing through the shutter, the ion detection device having a processing unit coupled to the collector and the first and second shutter elements, the method comprising:

applying, during a first predetermined time interval, a first voltage to the first shutter element and a second voltage to the second shutter element, the second voltage being less than the first voltage such that ions that enter the chamber of the ion detection device passes through the first shutter element and accumulate in a volume defined by the first and second shutter elements;

applying, during a second predetermined time interval, a third voltage to the first shutter element, higher than the first voltage, and a fourth voltage to the second shutter element, such that ions that entered the volume are compressed as the ions exit the volume, and new ions that enter the chamber are prevented from entering the volume; and detecting the compressed ions based at least on a current received from the collector and produced by ions arriving at the collector after the third and fourth voltages have been applied.

37. A method for detecting ions in an ion detection device having first, second, and third shutter elements provided in a chamber, the first shutter element facing an inlet and the shutter facing a collector that collects ions passing through the shutter, the ion detection device having a processing unit coupled to the collector and the first, second, and third shutter elements, the method comprising:

applying, during a first predetermined time interval, a first voltage to the first shutter element, a second voltage to the second shutter element, and a third voltage to the third shutter element, the first, second and third voltages decrease in this order such that ions entering the chamber of the ion detection device are permitted from entering a volume defined by the second and third shutter elements;

applying, during a second predetermined time interval, a fourth voltage to the first shutter element, a fifth voltage to the second shutter element, higher than the second voltage, and a sixth voltage to the third shutter element such that ions that entered the volume are compressed by a voltage gradient between the second and third shutter elements as the ions exit the volume and new ions entering the chamber are prevented from entering the volume by a voltage gradient between the first and second shutter elements; and detecting the compressed ions based at least on a current received from the collector and produced by ions arriving at the collector after the fourth, fifth and sixth voltages have been applied.

38. A method for detecting ions in an ion detection device having first, second, third, and fourth shutter elements provided in a chamber, the first shutter element facing an inlet and the shutter facing a collector that collects ions passing through the shutter, the ion detection device having a processing unit coupled to the collector and the first, second, third, and fourth shutter elements, the method comprising:

applying, during a first predetermined time interval, a first voltage to the first shutter element, a second voltage to the second shutter element, a third voltage to the third shutter element, and a fourth voltage to the fourth shutter element, the first, second and third voltages decrease in this order and the fourth voltage is higher than the third voltage such that ions entering the chamber of the ion detection device enter a first volume defined by the second and third shutter elements, and the ions are prevented from entering a second volume defined by the third and fourth shutter elements;

applying, during a second predetermined time interval, a fifth voltage to the first shutter element, a sixth voltage to the second shutter element, higher than the second voltage, a seventh voltage to the third shutter element, and an eighth voltage to the fourth shutter element such that ions that entered the first volume are accelerated in the first volume, and new ions entering the chamber are prevented from entering the first volume;

applying, during a third predetermined time interval, a ninth voltage to the first shutter element, a tenth voltage to the second shutter element, an eleventh voltage to the third shutter element, higher than the seventh voltage, and a twelfth voltage to the fourth shutter element such that the ions that entered the first volume are compressed as the ions exit the first volume and further compressed as the ions exit the second volume while the new ions are prevented from entering the first volume; and detecting the compressed ions based at least on a current received from the collector and produced by ions arriving at the collector after the ninth, tenth, and eleventh voltages have been applied.

39. A computer-readable storage medium encoded with computer instructions for operating an ion detection device including a chamber having an inlet and configured to receive ions through the inlet, a shutter provided in the chamber opposite the inlet and configured to allow or prevent the ions to pass the shutter, the shutter having first and second shutter elements, a collector provided in the chamber opposite the shutter and configured to collect ions passed through the shutter, and a processing unit electrically coupled to the first and second shutter elements and to the collector, the instructions when executed by the processing unit resulting in performance of steps comprising:

applying, during a first predetermined time interval, a first voltage to the first shutter element and a second voltage to the second shutter element, the second voltage being less than the first voltage such that ions that enter the chamber of the ion detection device passes through the first shutter element and accumulate in a volume defined by the first and second shutter elements; and applying, during a second predetermined time interval, a third voltage to the first shutter element, higher than the first voltage, and a fourth voltage to the second shutter element, such that ions that entered the volume are compressed as the ions exit the volume and new ions that enter the chamber are prevented from entering the volume; and detecting the compressed ions based at least on a current received from the collector and produced by ions arriving at the collector after the third and fourth voltages have been applied.

40. A computer-readable storage medium encoded with computer instructions for operating an ion detection device including a chamber having an inlet and configured to receive ions through the inlet, a shutter provided in the chamber opposite the inlet and configured to allow or prevent the ions to pass the shutter, the shutter having first, second and third shutter elements, a collector provided in the chamber opposite the shutter and configured to collect ions passed through the shutter, and a processing unit electrically coupled to the first, second, and third shutter elements and to the collector, the instructions when executed by the processing unit resulting in performance of steps comprising:

applying, during a first predetermined time interval, a first voltage to the first shutter element, a second voltage to the second shutter element, and a third voltage to the third shutter element, the first, second and third voltages decrease in this order such that ions entering a chamber of the ion detection device are permitted from entering a volume defined by the second and third shutter elements;

applying, during a second predetermined time interval, a fourth voltage to the first shutter element, a fifth voltage to the second shutter element, higher than the second voltage, and a sixth voltage to the third shutter element such that ions that entered the volume are compressed by a voltage gradient between the second and third shutter elements as the ions exit the volume and new ions entering the chamber are prevented from entering the volume by a voltage gradient between the first and second shutter elements; and detecting compressed the ions based at least on a current received from the collector and produced by ions arriving at the collector after the fourth, fifth and sixth voltages have been applied.

41. A computer-readable storage medium encoded with computer instructions for operating an ion detection device including a chamber having an inlet and configured to receive ions through the inlet, a shutter provided in the chamber opposite the inlet and configured to allow or prevent the ions to pass the shutter, the shutter having first, second, third and, fourth shutter elements, a collector provided in the chamber opposite the shutter and configured to collect ions passed through the shutter, and a processing unit electrically coupled to the first, second, third, and fourth shutter elements and to the collector, the instructions when executed by the processing unit resulting in performance of steps comprising:

applying, during a first predetermined time interval, a first voltage to the first shutter element, a second voltage to the second shutter element, a third voltage to the third shutter element, and a fourth voltage to the fourth shutter element, the first, second and third voltages decrease in this order and the fourth voltage is higher than the third voltage such that ions entering a chamber of the ion detection device enter a first volume defined by the second and third shutter elements, and the ions are prevented from entering a second volume defined by the third and fourth shutter elements;

applying, during a second predetermined time interval, a fifth voltage to the first shutter element, a sixth voltage to the second shutter element, higher than the second voltage, a seventh voltage to the third shutter element, and an eighth voltage to the fourth shutter element such that ions that entered the first volume are accelerated inside the first volume and new ions entering the chamber are prevented from entering the first volume; and applying, during a third predetermined time interval, a ninth voltage to the first shutter element, a tenth voltage to the second shutter element, an eleventh voltage to the third shutter element, higher than the seventh voltage, and a twelfth voltage to the fourth shutter element such that the ions that entered the first volume are compressed as the ions exit the first volume and further compressed as the ions exit the second volume while the new ions are prevented from entering the first volume; and detecting the compressed ions based at least on a current received from the collector and produced by ions arriving at the collector after the ninth, tenth, and eleventh voltages have been applied.

* * * * *